(12) United States Patent
Otiaba et al.

(10) Patent No.: US 11,998,060 B2
(45) Date of Patent: *Jun. 4, 2024

(54) ELECTRONIC VAPOR PROVISION SYSTEM

(71) Applicant: NICOVENTURES TRADING LIMITED, London (GB)

(72) Inventors: Kenny Otiaba, London (GB); David Leadley, London (GB)

(73) Assignee: NICOVENTURES TRADING LIMITED, London (GB)

( * ) Notice: Subject to any disclaimer, the term of this patent is extended or adjusted under 35 U.S.C. 154(b) by 0 days.

This patent is subject to a terminal disclaimer.

(21) Appl. No.: 17/929,536

(22) Filed: Sep. 2, 2022

(65) Prior Publication Data

US 2023/0109248 A1 Apr. 6, 2023

Related U.S. Application Data

(63) Continuation of application No. 16/478,725, filed as application No. PCT/GB2018/050061 on Jan. 10, 2018, now Pat. No. 11,432,589.

(30) Foreign Application Priority Data

Jan. 23, 2017 (GB) ...................... 1701102

(51) Int. Cl.
| | |
|---|---|
| *A24F 40/53* | (2020.01) |
| *A24F 40/10* | (2020.01) |
| *A24F 40/46* | (2020.01) |
| *A24F 40/57* | (2020.01) |
| *G01R 27/02* | (2006.01) |
| *H05B 1/02* | (2006.01) |

(52) U.S. Cl.
CPC .............. *A24F 40/53* (2020.01); *A24F 40/46* (2020.01); *A24F 40/57* (2020.01); *G01R 27/02* (2013.01); *H05B 1/0297* (2013.01); *A24F 40/10* (2020.01)

(58) Field of Classification Search
CPC .......... A24F 40/53; A24F 40/46; A24F 40/57; A24F 40/10; G01R 27/02; H05B 1/0297
See application file for complete search history.

(56) References Cited

U.S. PATENT DOCUMENTS

| | | | |
|---|---|---|---|
| 10,368,580 B2 * | 8/2019 | Rostami | A24F 40/30 |
| 11,432,589 B2 * | 9/2022 | Otiaba | A24F 40/46 |
| 2015/0320116 A1 * | 11/2015 | Bleloch | A61M 11/042 219/628 |
| 2017/0035115 A1 * | 2/2017 | Monsees | H05B 3/44 |

* cited by examiner

*Primary Examiner* — Natalie Huls
*Assistant Examiner* — Sharad Timilsina
(74) *Attorney, Agent, or Firm* — Husch Blackwell

(57) ABSTRACT

An electronic vapor provision device comprises: includes a first electrical resistive heater for vaporizing a precursor material to generate vapor in an airflow for inhalation by a user and a second electrical resistive heater for vaporizing the precursor material and/or heating said airflow. The first electrical resistive heater has a first thermal coefficient of resistance which is less than a second thermal coefficient of resistance of the second electrical resistive heater. The device further includes a control system to monitor for a change in the resistance of at least the second electrical resistive heater. The second electrical resistance heater therefore serves both as a heater and as a temperature monitor.

15 Claims, 4 Drawing Sheets

ELECTRONIC VAPOR PROVISION SYSTEM

PRIORITY CLAIM

The present application is a Continuation of U.S. application Ser. No. 16/478,725, filed Jul. 17, 2019, which, in turn is a National Phase entry of PCT Application No. PCT/GB2018/050061, filed Jan. 10, 2018, which claims priority from GB Patent Application No. 1701102.4, filed Jan. 23, 2017, each of which is hereby fully incorporated herein by reference.

FIELD

The present disclosure relates to an electronic vapor provision system, e.g. an e-cigarette.

BACKGROUND

Electronic vapor provision systems such as e-cigarettes generally contain a reservoir of liquid which is to be vaporized (referred to herein as e-liquid). These systems are further provided with a heater, for example a wire coil, and some form of transport mechanism (e.g. a wick) to convey the liquid from the reservoir to the heater. Such systems generally also contain a control unit and a battery, whereby the control unit operates the battery to provide power to a heater to vaporize a small amount of the liquid, which vapor is then inhaled by the user. Most e-cigarettes are powered by re-chargeable lithium ion batteries (or cells), which are to be found in a very widespread range of devices, not just e-cigarettes. Often the reservoir and heater are located in one unit (referred to as a cartridge or cartomizer), while the battery and control unit are located in a separate, detachable unit (sometimes referred to as the control unit or device portion).

An e-cigarette therefore generally incorporates two consumables, firstly the liquid to be vaporized, and secondly power in the battery. Regarding the former, once the reservoir of liquid has been exhausted, at least a portion of the device containing the reservoir, e.g. the cartridge, may be discarded to allow replacement with a new cartridge (although some systems permit re-filling of the cartridge). Regarding the latter, an e-cigarette usually provides some form of electrical connector to receive power from an external charging supply, thereby allowing the battery within the e-cigarette to be re-charged. Accordingly, the device portion is sometimes referred to as the re-usable component, while the cartridge is referred to as the disposable component.

E-cigarettes can typically be categorized as either button-operated or puff-activated, according to how the control unit determines when to activate (provide power to) the heater. In the former, a user presses (or touches) a button on the external surface of the e-cigarette, which cause the control unit to activate the heater. In the latter, an airflow or pressure sensor is used to detect when a user inhales on the e-cigarette, and this detection then triggers activation of the heater.

One of the challenges for e-cigarettes is being able to produce sufficient vapor in a short time—typically within a second or so for a given user puff. This has led to the use of lithium cells as the normal power source for such devices, as mentioned above. In some designs, the e-cigarette is also provided with multiple heaters, e.g. multiple coils, to support a greater rate of vaporization.

On the other hand, the utilization of high-powered heaters within e-cigarettes is not without potential problems. For example, such heaters may rely on the vaporization of the liquid in order to remain cool. In other words, incoming liquid from the wick cools the heater, as does the heater first heating and then vaporizing the liquid. However, this can lead to an issue if a portion of a heater, which is designed to be cooled by the vaporization of liquid, does not in fact receive incoming liquid. Such a problem may be caused, for example, by the exhaustion of the liquid in the reservoir, and/or by some blockage or obstruction along the wick. In this situation, sometimes referred to as a dry-out, the heater coil (or other form of heater), may become hotter than intended.

A dry-out or other form of over-heating (e.g. due to an electrical fault) may potentially cause a number of problems. For example, the heater may become hot enough to damage itself or other components within the system. In addition, the heat may flow to an external surface of the system, which might then become hot for a user to touch. Furthermore, if liquid is vaporized on an over-heated portion of the heater, this may lead to some breakdown or other chemical reactions within the liquid/vapor, potentially producing by-products with impaired flavor or safety characteristics.

Some attempts have been made to protect against a dry-out or other occurrence of over-heating by providing some form of temperature sensing. In particular, such systems may try to detect a sudden rise in temperature of, or adjacent to, the heater, in which case the control unit may then decide to reduce or prevent power flowing from the battery to the heater. However, there are some practical constraints on providing such temperature sensing. For example, the heater is usually located in the cartridge or cartomizer, which is often a disposable portion—hence there is pressure to keep the cartridge relatively simple to minimize recurring costs and wastage for a user. Furthermore, the interface between a cartridge and a control or device portion is often relatively simple—again to reduce costs, and also to maintain ease of operation, connectivity, etc.

One approach to detecting dry-outs in such circumstances has been to measure the resistance of the heater coil, as seen from the control portion. Thus the control portion already has two power connections (positive and negative) to the cartomizer and a battery providing known (or measured) voltage. It then becomes feasible to monitor the current flow to/from the cartridge to look for a significant change during the course of a user puff.

For example, a dry-out may lead to a significant localized rise in temperature, and hence a significant associated rise in electrical resistance. This in turn will lead to a drop in the current flowing from the device portion to the cartomizer (and back again). This current could be monitored in order to detect such a drop, and if one occurred, the control unit would be able to reduce or end the power supply to the heater coil.

Although such an approach for monitoring dry-outs is theoretically sound, it is difficult to make effective in practice. In particular, for known e-cigarette systems, the rise in resistance due to a dry out is relatively small compared with the overall resistance of the heater coil, and hence it is difficult to determine for certain whether or not a perceived drop in current flow is actually indicative of a genuine dry-out or some other abnormality. Accordingly, the risk of localized overheating remains relevant for many existing designs of e-cigarette.

SUMMARY

An electronic vapor provision device comprises: a first electrical resistive heater for vaporizing a precursor material to generate vapor in an airflow for inhalation by a user; a second electrical resistive heater for vaporizing the precursor material and/or heating said airflow, wherein the first electrical resistive heater has a first thermal coefficient of resistance which is less than a second thermal coefficient of resistance of the second electrical resistive heater; and a control system configured to monitor for a change in the resistance of at least the second electrical resistive heater.

BRIEF DESCRIPTION OF THE DRAWINGS

Various embodiments of the disclosure will now be described in detail by way of example only with reference to the following drawings.

DETAILED DESCRIPTION

As described above, the present disclosure relates to an electronic vapor provision system, such as an e-cigarette. Throughout the following description the term "e-cigarette" is used; however, this term may be used interchangeably with electronic vapor provision system, electronic aerosol delivery system, and other similar expressions.

Figure 1:
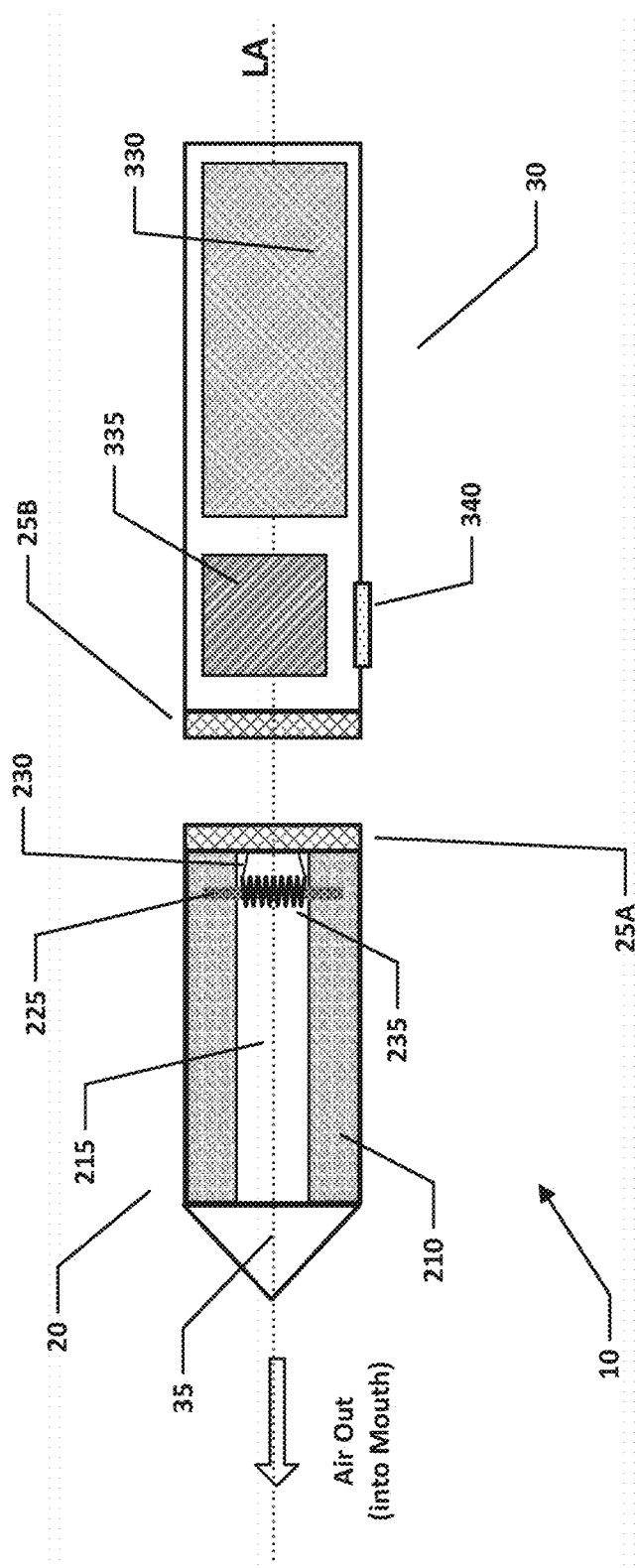
FIG. 1 is a schematic diagram of an e-cigarette in accordance with some embodiments of the disclosure.

FIG. 1 is a schematic diagram of an e-cigarette 10 in accordance with some embodiments of the disclosure (not to scale). The e-cigarette 10 has a generally cylindrical shape, extending along a longitudinal axis indicated by dashed line LA, and comprises two main components, namely a cartomizer 20 and a device or body portion 30. The cartomizer 20 is detachable from the body 30, as shown in FIG. 1, for example, to allow the cartomizer 20 to be replaced (or refilled) if the e-liquid has been exhausted. In use, the cartomizer 20 and the body 30 are joined together. In particular, each of the cartomizer 20 and the body 30 is provided with a respective connector 25A, 25B (referred to herein in combination as connector 25) that provide mechanical and electrical connectivity between the cartomizer 20 and the body 30 when they are attached to one another. For example, connector 25 may provide a screw, bayonet, or push fit between the cartomizer 20 and the body 30.

The body portion 30 includes a battery or cell unit 330, an operating button 340, a printed circuit board (PCB) 335 containing various electronics, and connector 25B (please note that the electrical wiring between these different components is omitted for clarity). The battery unit 330 is typically re-chargeable and may support re-charging via a wired connection to one or more of connector 25B, to a tip connector (not shown) located on the end of the body 30 opposite to connector 25B, and/or to a separate connector, e.g. a micro-USB connector (not shown) accessible via the exterior of body 30. The battery may also support wireless re-charging via induction. (In practice, most e-cigarettes only provide a subset of one or two or these re-charging facilities). Although only a single PCB 335 is shown in FIG. 1, it will be appreciated that this may be implemented as multiple PCBs. In addition, connector 25B and/or battery unit 330 may potentially also include a PCB.

Button 340 is operated in order to activate the e-cigarette 10 for inhalation. Button 340 may be a push-button, a touch sensitive button, a switch, or any other suitable facility. Some e-cigarettes may remain activated for as long as button 340 is operated (potentially subject to some maximum activation period); other e-cigarettes may be activated for a predetermined period of time (e.g. a few seconds) in response to a single operation of the button—e.g. one operation of the button is used to activate the e-cigarette for a single puff. In general, activation of the e-cigarette 10 involves power from the battery 330 being supplied via connector 25 to the cartomizer 20 to vaporize e-liquid for inhalation by the user.

The cartomizer 20 includes an internal chamber containing a reservoir 210 of e-liquid. The liquid in the reservoir 210 may include nicotine in an appropriate solvent, and may include further constituents, for example, to aid aerosol formation, and/or for additional flavoring. This liquid may be held inside the chamber in some form of material, e.g. sponge, foam, or wadding, or may be provided as free liquid. Running through the centre of the reservoir 210 is an air passage 215, which leads to a mouthpiece 35. In operation, e-liquid from reservoir 210 is vaporized (as described in more detail below), and the vapor then flows along air tube 215 and out through mouthpiece 35 to be inhaled by the user. Note that for clarity, the air inlet and air exit holes are not shown in FIG. 1. The air inlet holes may be provided on the exterior of the cartomizer 20, for example, close to (or as part of) connector 25A. The air inlet holes may alternatively (or additionally) be provided on an external surface of the body 30, in which case the connector 25 will generally include an air path that links to air path 215. Note that although FIG. 1 shows the air path 215 as flowing through the centre of reservoir 210 (which therefore has a tubular or annular shape), in other implementations, the air path 215 may be provided to one side of the reservoir 210, e.g. away from the main axis LA, and adjacent an outer wall of the cartomizer 20.

The cartomizer 20 is further provided with a wick 225 which transports e-liquid from the reservoir 210 to a heater or vaporizer 235 for vaporization. The wick 225 may be formed of a suitable material, e.g. a fibrous material, such as (organic) cotton, glass fiber, etc, or some other form of porous material, e.g. a porous ceramic, a sintered substance, and so on. The cartomizer may be provided with appropriate sealing (not shown) around the location(s) where the wick 225 passes from the reservoir 210 into the air path 215 to prevent leakage of e-liquid from the reservoir 210 directly into the air path 215 (rather than the e-liquid being transported to the heater 235 via wick 225).

The heater 235 is shown for simplicity in FIG. 1 as a single coil which is wrapped around the wick 225 (although as will be described in more detail below, the structure of heater 235 is more complicated than just a single coil). The heater 235 is electrically linked to the connector 25A by wires 230. When button 340 is pressed (or otherwise operated), the control unit 335 provides power from the battery 330 via connector 25 and wires 230 to the heater 235, which vaporizes liquid from wick 225. This vapor is then drawn along the air path and out through mouthpiece 35 into the mouth of a user by the user inhaling (puffing) on the e-cigarette 10. In addition, wick 225 draws out further e-liquid from the reservoir 210 to replace the e-liquid which has been vaporized, and hence the e-cigarette 10 is then ready for further use.

Although the e-cigarette 10 of FIG. 1 is operated (activated) by button 340, other e-cigarettes are puff-sensitive. For this type of e-cigarette 10, when a user inhales through the mouthpiece 35, air is drawn into the e-cigarette 10 (typically the body 30) through the one or more air inlet holes, which are suitably located on the outside of the e-cigarette 10. This airflow (or the resulting change in pressure) is detected by a pressure or airflow sensor that in turn activates the heater 235 to vaporize the liquid from the reservoir 210 (via the wick 225). Some devices also utilize a dual activation mechanism, i.e. they are pressure-sensitive, but also require a button or similar facility to be operated in order to activate the heater.

Although the e-cigarette 10 of FIG. 1 is shown as a two-part device, comprising a cartomizer 20 and a body 30, other implementations may comprise a one-piece device—for example, if the cartomizer reservoir 210 can be re-filled without the need for disassembly from the body 30, or if the device is intended for disposal once all the liquid from the reservoir 210 has been dispensed. Other implementations may comprise more than two components, for example, the vaporizer portion may be separate (separable) from a replaceable cartridge of e-liquid.

Figure 2:
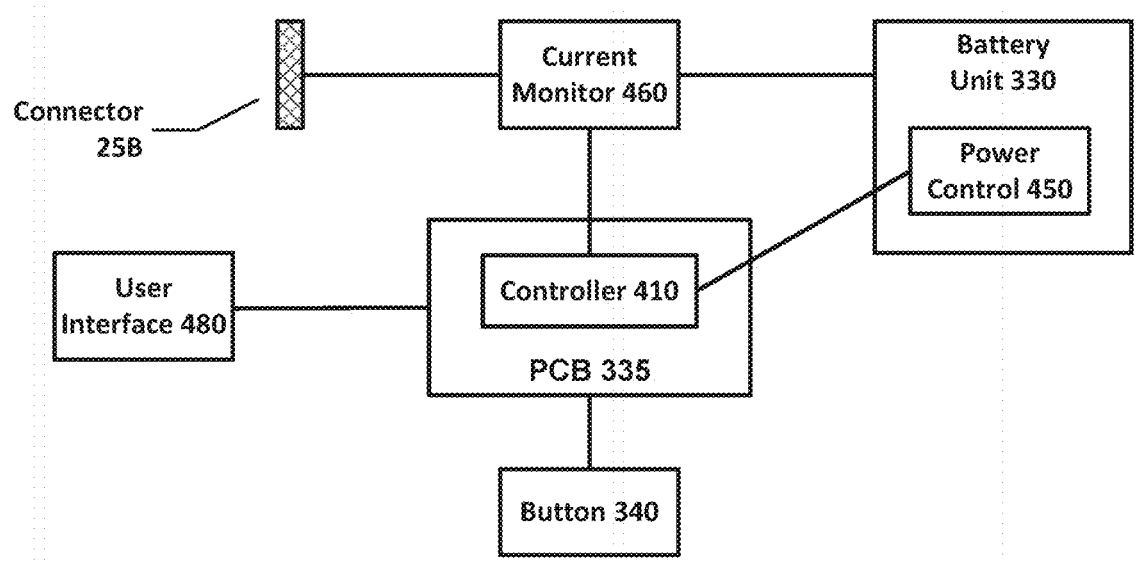
FIG. 2 is a schematic circuit diagram of some of the electrical and electronic components of the e-cigarette of FIG. 1 in accordance with some embodiments of the disclosure.

FIG. 2 is a schematic (simplified) diagram of the main electrical (electronic) components of the e-cigarette 10 of FIG. 1 in accordance with some embodiments. These components are generally located in the device portion (body) 30, since this is re-usable (rather than disposable). Note that this diagram is mainly concerned with functional connections, rather than supply power lines to the various components within the body 30 (although the power supply line from the battery unit 330 to the connector 25B is shown).

As discussed above, the device portion 30 includes a battery unit 330 for powering the e-cigarette 10, as well as a printed circuit board (PCB) 335 on which is mounted a controller 410. The PCB 335 may be positioned alongside, or at one end of, the battery 330. In the configuration shown in FIG. 1, the PCB 335 is located between the battery 330 and the connector 25B. The controller 410 may comprise, for example, an application specific integrated circuit (ASIC), microprocessor or microcontroller, for controlling the e-cigarette 10. In some implementations, the controller 410 includes a processor such as a CPU, and memory (ROM and/or RAM). The operations of the controller 410 (and hence also other electronic components in the e-cigarette 10), are generally controlled at least in part by software programs running on the processor (and/or on the other electronic components as appropriate). Such software programs may be stored in non-volatile memory, which can be integrated into the controller 410 itself, or provided as a separate component (not shown). The processor may access the ROM to load and execute individual software programs as and when required.

The body further includes connector 25B, which provides mechanical and electrical connectivity between the body 30 and the cartomizer 20. The connector 25B typically includes two electrical contacts (not shown in FIG. 2) to act as positive and negative terminals for supplying power from the battery 330 to the heater 235 within cartomizer 20. The two electrical contacts may have any appropriate configuration—e.g. side by side, or an inner contact surrounded by a ring forming an outer contact, depending upon the particular design of the connector 25.

The body 30 further includes a button 340, which is operated as discussed above to activate the e-cigarette 10, and a user interface 480 (not shown in FIG. 1). The user interface 480 may provide for audio and/or visual output to provide status information to a user—e.g. a light which is green when the battery is fully charged, but orange when the battery is nearly discharged. Different audio and/or visual signals for signaling different states or conditions may be provided by utilizing tones or beeps of different pitch and/or duration, by providing multiple such beeps or tones, by utilizing colored or flashing lights, and so on.

The battery unit 330 used in e-cigarette 10 most commonly includes a lithium ion cell. This type of battery produces an output voltage when fully charged of about 4.2V, declining to about 3.6V when discharged. Other embodiments however may utilize other battery types as appropriate. The battery unit 330 further includes an in-built power control system 450, which is linked to the controller 410. The controller 410 is able to turn the battery output to the connector 25B off and on using the power control system 450 (the controller 410 itself may still be able to draw some power from the battery unit in order to provide control functionality).

For most of the time, the power control system 450 generally prevents output from the battery 330 to the connector 25B. However, if a user operates button 340, then the controller 410 may signal the power control system 450 to supply power from the battery unit 330 to the heater 235 for a predetermined period of time, after which predetermined period of time, the controller 410 instructs the power control system 450 to turn off again the power supply from the battery unit 330 to the cartomizer 20.

The power control system 450 may also be able to regulate the amount of current supplied from the battery unit 330 to the cartomizer 20. One way of achieving this is to utilize pulse width modulation (PWM), in which the battery unit 330 supplies power ("on") for a first predetermined period of time ($T_{on}$), and then does not supply power ("off") for a second predetermined period of time ($T_{off}$). This pattern is repeated, with an overall period of $T_{on}+T_{off}$ with a duty cycle (the proportion of time spent on) of $T_{on}/(T_{on}+T_{off})$. The duty cycle therefore falls within the range 0-1; as the duty cycle increases towards 1 (unity), the power output from the battery unit 330 approaches the maximum available from the battery unit 330. Note that the repetition period ($T_{on}+T_{off}$) is generally much less than the thermal response time of the heater 235. Accordingly, the heater temperature does not oscillate significantly with individual cycles of the PWM pattern, but rather reflects the overall duty cycle. In other words, the effective heating current supplied with a duty cycle of 0.5 is only half the effective heating current that is supplied with a duty cycle of 1.0 (which, in effect, represents a constant level of current without PWM). The effective heating current supplied with a duty cycle of 0.25 is then only half the effective heating current that is supplied with a duty cycle of 0.5, and so on. Thus the controller 410 can set the duty cycle utilized by the power control system 450 in order to manage (control) the power level supplied from the battery 330 to the cartomizer 20—including turning off the power supplied to the cartomizer 20 by setting a duty cycle of 0 (zero).

There are various reasons for the controller 410 to use PWM (or any other analogous scheme) for controlling the current level supplied from the battery 330 to the cartomizer 20. One reason is to compensate for the lower voltage available from the battery 330 when the battery 330 is nearly discharged—i.e. as the output voltage falls, the duty cycle can be increased to help ensure that the output power level is kept constant. Another reason is to provide more sophisticated control over the heater temperature, for example, having a high duty cycle (say, unity) during an initial part of a puff, so that the heater temperature rises as quickly as possible to a suitable operational temperature, and then reducing the duty cycle once this operational temperature has been achieved, so that the heater 235 remains at (but is not heated above) the operational temperature.

As also shown in FIG. 2, the supply path from the battery 330 to the connector 25B (and hence to the cartomizer 20) includes a current monitor 460. The current monitor 460 measures how much current is being drawn from the battery 330 and supplied to the cartomizer 20. In general terms, a cartomizer 20 will take quite a large current from battery 330, e.g. from 1 to several amps, in order to operate the heater 235 to provide quick vaporization of liquid. Assuming an output of 4V for a lithium ion battery and a 2A current, this implies a resistance for the cartomizer 20 of about 2 ohms. The current monitor 460 can operate in any suitable manner. For example, it may directly measure the current passing through (e.g. by sensing the resulting magnetic field), or it may measure the voltage across a known resistor. The current monitor 460 informs the controller 410, on an ongoing basis, of the measured value of current supplied to the cartomizer 20, and more particularly to heater 235. This allows the controller 410 to track the current supplied to the cartomizer 20.

The controller 410 may also measure the voltage output from the battery 330 (which as noted above will generally drop during the discharge cycle). This can be achieved, for example, by comparing against one or more voltage reference sources (not shown in FIG. 2). Assuming that the voltage drop over the current monitor 460 is known (or can be compensated for), the combination of the voltage and current values supplied to the cartomizer 20 can be used to determine the resistance of the cartomizer 20.

Although FIG. 2 shows an example configuration for the electronic components of e-cigarette, the skilled person will be aware of many possible different configurations. For example, in the implementation of FIG. 2, the controller 410 uses the power control system 450 both for implementing an on/off setting for the output from battery 330 to the cartomizer 20, and also for managing the duty cycle when there is an on setting for power supply. In some implementations however, there may be a first unit for determining the on/off setting for the output from battery 330 to the cartomizer 20, and a second unit to manage the duty cycle (both under the control of the controller 410). In addition, although button 340 is shown in FIG. 2 as linking to the controller 410, which then controls the supply of power from the battery unit 330 to the cartomizer 20 accordingly, in other implementations the button may be placed directly on the power supply line from the battery unit 330 to the cartomizer 20, and open or close this power supply line according to the operational state of the button. Furthermore, the functionality of the controller 410 may be distributed across one or more components which act in combination as a controller 410.

Figure 3:
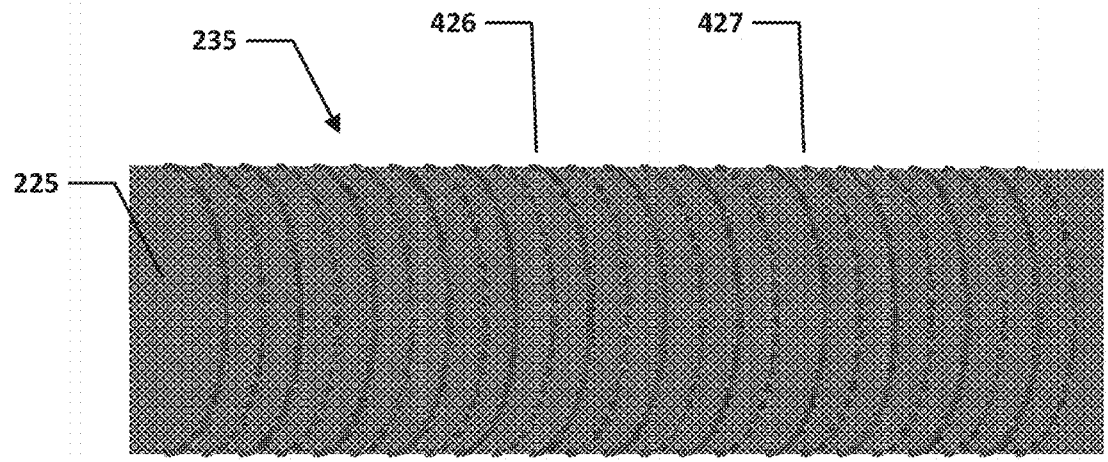
FIG. 3 is a schematic diagram of the heater of the e-cigarette of FIG. 1 in accordance with some embodiments of the disclosure.

FIG. 3 is a schematic diagram of the heater 235 of the e-cigarette of FIG. 1 in accordance with some embodiments of the disclosure. The heater 235 comprises two coils wound around the wick 225, the first coil denoted 426, the second coil denoted 427. (Note that for clarity, coil 427 is depicted schematically using a dashed line to distinguish it from coil 426; however, in practice, both coils are continuous in order to support the flow of electricity along their length).

The first coil 426 is typically made of a conventional material for an e-cigarette heater coil, such as nichrome—an alloy of nickel and chromium. A standard example of nichrome for use as a heater coil wire is formed of approximately 80% Ni and 20% Cr (by mass), although other nichrome alloys may include small amounts of other materials, such as iron and/or carbon, and also the proportions of nickel and chromium are quite variable. The main reasons for using nichrome coil as a heater coil are its resistance to oxidation and general stability at high temperature, and also its resistance to corrosion (which is important when the coil is used to vaporize an e-liquid).

As discussed above, it has been considered to use the resistance of a heater coil to assess temperature in an e-cigarette. Thus in a linear approximation, the variation of resistance of a material, e.g. a heating coil, with temperature can be represented as:

$$R(T)=R(T_0)(1+\alpha \Delta T)$$

where $R(T)$ is the resistance at temperature T (and will now, for simplicity, be written as R, $R(T_0)$ is the resistance at temperature $T_0$ (and will now, for simplicity, be written as R0), $\Delta T=T-T_0$, and a is the temperature coefficient of resistance. For nichrome, a typical value of this coefficient is relatively low at: $\alpha \approx 4\times 10^{-4}$ $K^{-1}$ for $T_0$=293K (N.B. the actual value is sensitive to the precise composition etc). As a result, the change in resistance with temperature is relatively small, and therefore the sensitivity to temperature variations is likewise quite low.

Consider, for example, a nichrome heater coil having a resistance of 2Ω when operating at a temperature of 200° C. (473K). If we now assume that a portion (20%) of the coil over-heats by another 50° C., i.e. to 250° C. (523K), then we have the following two expressions for the overall resistance before and after the over-heating:

$$2=R0(1+\alpha 180)$$

$$R=0.2R0(1+\alpha 230)+0.8\times 2$$

Eliminating R0 gives the following expression:

$$R=1.6+[0.4(1+\alpha 230)/(1+\alpha 180)]$$

Assuming that at these temperatures we still have $\alpha \approx 4\times 10^{-4}$ $K^{-1}$, we can multiply out to find:

$$R=1.6+0.4075=2.0075\Omega— \quad \text{(Example 1)}$$

In other words, the change in resistance for the coil as a whole is only 0.0075Ω in absolute terms, or 0.375% in relative terms. It will be appreciated that this is difficult to measure accurately (especially in the context of e-cigarette 10).

Even if we change the figures, so that the whole coil rises in temperature by 100° C., i.e. from 473K (T1) to 573K (T2), then we have the following two expressions for the overall resistance before and after the over-heating:

$$2=R0(1+\alpha(T1-T_0))$$

$$R=R0(1+\alpha(T2-T_0))$$

Again eliminating R0 gives:

$$R=2[(1+\alpha(T2-T_0))/(1+\alpha(T1-T_0))]$$

And we multiply out to find:

$$R=2.075\Omega— \quad \text{(Example 2)}$$

Therefore, the change in resistance for the coil as a whole is still only 0.075Ω in absolute terms, or 3.73% in relative terms.

Note that because the changes in resistance are relatively small, we can approximate the above formula, $R=2[(1+\alpha(T2-T_0))/(1+\alpha(T1-T_0))]$, as follows:

$$R(T2)/R(T1)=[(1+\alpha(T2-T_0))*(1+\alpha(T1-T_0))]\approx 1+\alpha(T2-T1)$$

In view of the above considerations, the second coil 427 of FIG. 3 is made of a different material from the coil 426. For example, this coil may be made of titanium, which is both refractory (resistant to high temperatures) and also resistant to corrosion. Moreover, the temperature coefficient of resistance for titanium is $\alpha\approx 3.5\times 10^{-3}$ K$^{-1}$ (again, this is sensitive to impurities, etc).

We assume that the first coil 426 and the second coil 427 are connected in series, and that each coil has a resistance of 1Ω at the normal (default) operating temperature. This then gives a total resistance for the overall heater of 2Ω, i.e. the same as for examples 1 and 2 above (and so the same power is provided to the heater for a given voltage supply). For the situation of example 1 above, in which 20% of each heater is assumed to rise an additional 50° C., the total rise in resistance is approximately 0.0037Ω for coil 426 and 0.021Ω for coil 427, to give a total rise in resistance of approximately 0.0247Ω—this is over 3 times bigger than achieved in example 1 for just coil 427 by itself. A similar rise is also achieved if the first coil 426 and the second coil 427 are connected in parallel, and each coil has a resistance of 4Ω (which would again give a total resistance for the overall heater of 2Ω, i.e. the same as for examples 1 and 2 above).

The use of the first coil 426 and the second coil 427, where the second coil 427 has a significantly larger thermal coefficient of resistance, provides an enhanced ability to monitor, detect, and protect against overheating within the e-cigarette 10, more particularly, within the cartomizer 20 (or other portion of the e-cigarette 10 that includes the first 426 and second 427 coils). As previously mentioned, such over-heating might result from a localized or complete exhaustion of e-liquid for vaporization by the heater 235, or from various other sources, such as an electric fault, operation in a confined space (so no external cooling), etc. The higher temperature sensitivity provided in accordance with some examples may also (or alternatively) be used to help maintain a desired vaporization temperature during normal operation of the e-cigarette.

In operation therefore, the current monitor 460 tracks the level of current supplied to the heater 235. In some cases, the current level may be utilized indirectly as an indicator of resistance, in effect assuming a constant voltage (over a time period of interest). Alternatively, the system may directly monitor the resistance by combining the monitored current level with a known, estimated or measured voltage supplied to the cartomizer 20 by the battery 330. For both the indirect or direct approach, the controller 410 tracks the monitored indication of the level of resistance, and detects any anomalous situation—for example, a relatively sudden rise in indicated resistance level, and/or an unusually high level of resistance. Bearing in mind that resistance typically increases with temperature (although some materials have a negative thermal coefficient of resistance), a sudden increase of the monitored resistance or an unusually high value of this resistance (for example) may indicate over-heating within the cartomizer.

In practice, the controller may be provided with various thresholds (or similar) to help discriminate between normal and abnormal behavior. For example, when the button 340 is first operated and the heater 235 is activated, it is expected that the heater resistance will rise (and hence the current fall). This would represent normal operation of the device. However, if the heater resistance continued to rise, or suddenly rose later during the inhalation, this is more likely to represent abnormal operation of the device. Accordingly, the controller 410 might be configured, for example, to look for a current fall (and hence temperature rise) that occurs after a predetermined time threshold since the beginning of an inhalation. Appropriate settings for these thresholds may be determined empirically and/or by modeling the operation of a given device.

In other implementations, the controller 410 might be configured to look for a current fall (and hence a temperature rise) during the initial heating period (instead of, or as well as later in the heating procedure). One motivation for this would be to provide a quick identification of any potential problem on each occasion that the device is used, so that appropriate remedial action could be taken as soon as possible. Another motivation is that some systems use an initial period of full power (duty cycle of unity) to heat the heating element to a desired temperature, and then reduce the duty cycle to maintain the heating element at this desired temperature. In may be easier in practice to identify an anomalous rise in resistance during the initial phase of constant full power than in the subsequent phase when power is modulated in accordance with the reduced duty cycle.

If the controller 410 does detect some abnormal situation based on the current level as tracked by monitor 460, for example, a sudden fall in current which is likely to be caused by a rise in resistance, typically representative of over-heating, the controller 410 may take appropriate remedial (compensatory) action. For example, the controller 410 may instruct the power control system 450 to restrict (reduce) or even turn off the power supply from the battery to the heater 335. The controller 410 might also provide some form of visual warning to a user via user interface 480.

The use of the first coil 426 and the second coil 427 as described above for providing such detection of, and hence protection against, over-heating offers a number of advantages. Thus by including a second coil 427 which has a higher thermal coefficient of resistance (and hence higher thermal sensitivity) than the first coil 426, the device is made more sensitive to such over-heating, in that a given level of over-heating produces a greater change in resistance, and hence current level, which can therefore be detected more easily. On the other hand, it may not be desirable to have the heater 235 made entirely of a material having a higher thermal coefficient of resistance (i.e. in effect using just the second coil 427, not the first coil 426). For example, the material of the second coil 427 may be more expensive, or less efficient at heating, or more susceptible to corrosion, etc. In some cases, it may therefore be desirable to arrange for the majority of the power supplied by the cartomizer 20 to be utilized by the first coil 426 rather than by the second coil 427 (e.g. because this is more efficient, or may help protect coil 427). Some potential options for addressing these various concerns are discussed below.

Moreover, the use of the first coil 426 and the second coil 427 is consistent with a conventional two terminal interface between the cartomizer 20 and the device portion 30 (in contrast, for example, to the use of a dedicated sensor, which might require electrical separation from the heater 35, and hence an additional terminal between the cartomizer 20 and the device portion 30). In addition, the heater 235 may be designed such that the electrical energy dissipated by the second coil 427 contributes to the overall operation of the e-cigarette 10. For example, it may assist in vaporization, or heating the airflow through the cartomizer 20 (downstream or upstream of the heater 235 itself). Accordingly, the first coil 426 may be considered primarily as a heater coil, and secondarily as a sensor coil (for monitoring resistance), whereas the second coil 427 may be considered primarily as a sensor coil, and secondarily as a heater coil. This approach can therefore help to maintain efficiency while providing improved functionality in terms of protection against overheating.

Typically, the thermal coefficient of resistance of the second coil 427 is greater than the thermal coefficient of resistance of the first coil 426 by a significant factor, e.g. at least two, for example four or eight (as for the above example of nichrome and titanium). In some implementations, the thermal coefficient of resistance of the first coil 426 is less than $1\times10^{-3}$ $K^{-1}$ at room temperature, e.g. less than $5\times10^{-4}$ $K^{-1}$ at room temperature for various forms of nichrome, while the second thermal coefficient of resistance of the second coil 427 is greater than $1\times10^{-3}$ $K^{-1}$ at room temperature, e.g. greater than $2.5\times10^{-3}$ $K^{-1}$ at room temperature for titanium or other metals/alloys such as nickel or steel.

The examples given above have the first coil 426 in parallel with or in series with the second coil 427. It will be appreciated that the former option is well-suited to the pattern of connecting wires 230 shown in FIG. 1, which has one wire to connector 25A from each end of the heater 235. However, the pattern of connecting wires utilized for the latter option might be different from that shown in FIG. 1, e.g. both connecting wires to connector 25A go from one end of the heater 235, and the first and second coils 426, 427 join together at the opposite end of the heater 235. The skilled person will be aware of further potential wiring arrangements according to the various possible configurations of the coils.

Figure 4A:
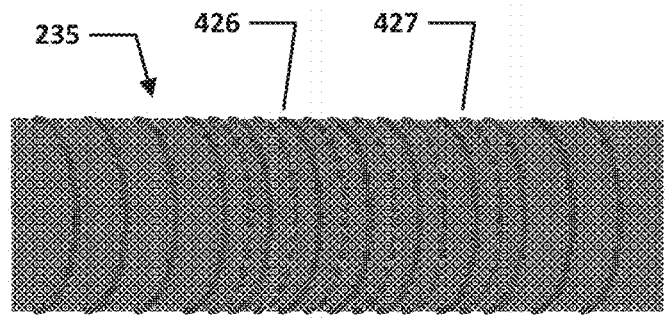
FIGS. 4A-4C show examples of various possible configurations for the heater of the e-cigarette of FIG. 1 in accordance with some embodiments of the disclosure.
Figure 4B:
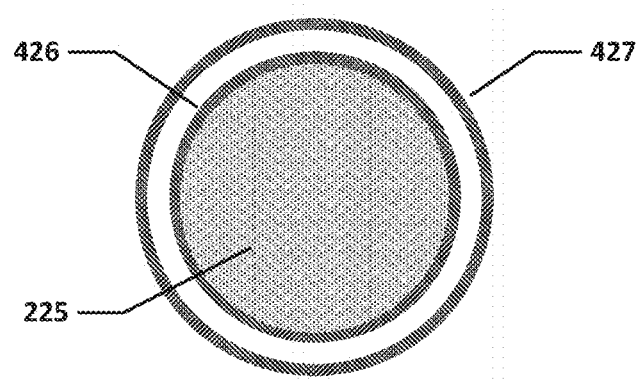
Figure 4C:
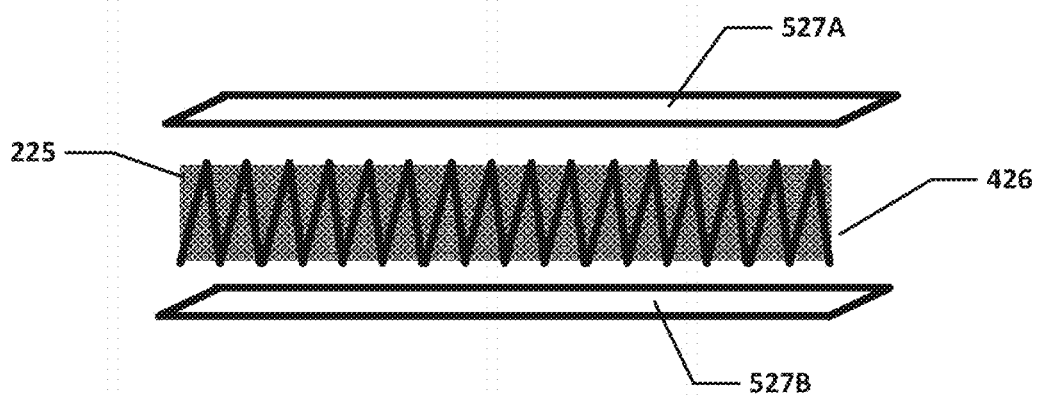

FIGS. 4A-4C show examples of various possible configurations for the heater 235. FIG. 4A is similar to the arrangement of FIG. 3, except that the second coil 427 is only located along the central portion of the heater 235. It will be appreciated that this central portion of the heater represents the furthest point of travel for e-liquid along the wick 225 from the reservoir 210 for the typical arrangement in which both ends of the wick 225 are in contact with liquid in the reservoir 210, and hence is potentially most prone to dryout. Reducing the length of the second coil 427 can help to save cost and/or reduce the resistance of the second coil 427—the latter aspect may allow the majority of the power to be dissipated by the first coil 426 albeit with a correspondingly reduced sensitivity to temperature (for a series arrangement at least).

FIG. 4B shows a cross-sectional view, i.e. perpendicular to the coil axes, with the first coil 426 again wound on wick 225. In this implementation however, the second coil 427 has a greater radius than the first coil 426, and so is separated from the wick 225. This configuration might be helpful to reduce direct contact between the liquid on the wick 225 and the second coil 427, for example to help minimize possible corrosion. Nevertheless, the heat from the second coil 427 can still contribute to the vaporization of the e-liquid. Note that in this implementation, the second coil 427 may extend the full axial length of the first coil 426, as shown in FIG. 3, or only part of the length, as shown in FIG. 4B.

FIG. 4C shows another implementation, again with the first coil 426 wrapped about a wick 225. However, in this implementation, the second coil 427 has been replaced by two strip heaters 527A and 527B, positioned above and below the first coil 426 (but not in contact with the first coil 426). The geometry of this configuration is therefore somewhat similar to that of FIG. 4B, with the heater of the more thermally sensitive material outside the first coil 426, but a different type of resistive heater is used (not a coil). This arrangement of strip heaters 527A, 527B might be used if, for example, the more thermally sensitive material was more difficult or expensive to form into a wire, or to provide a different level of resistance compared with a coil wire, etc.

Figure 5A:
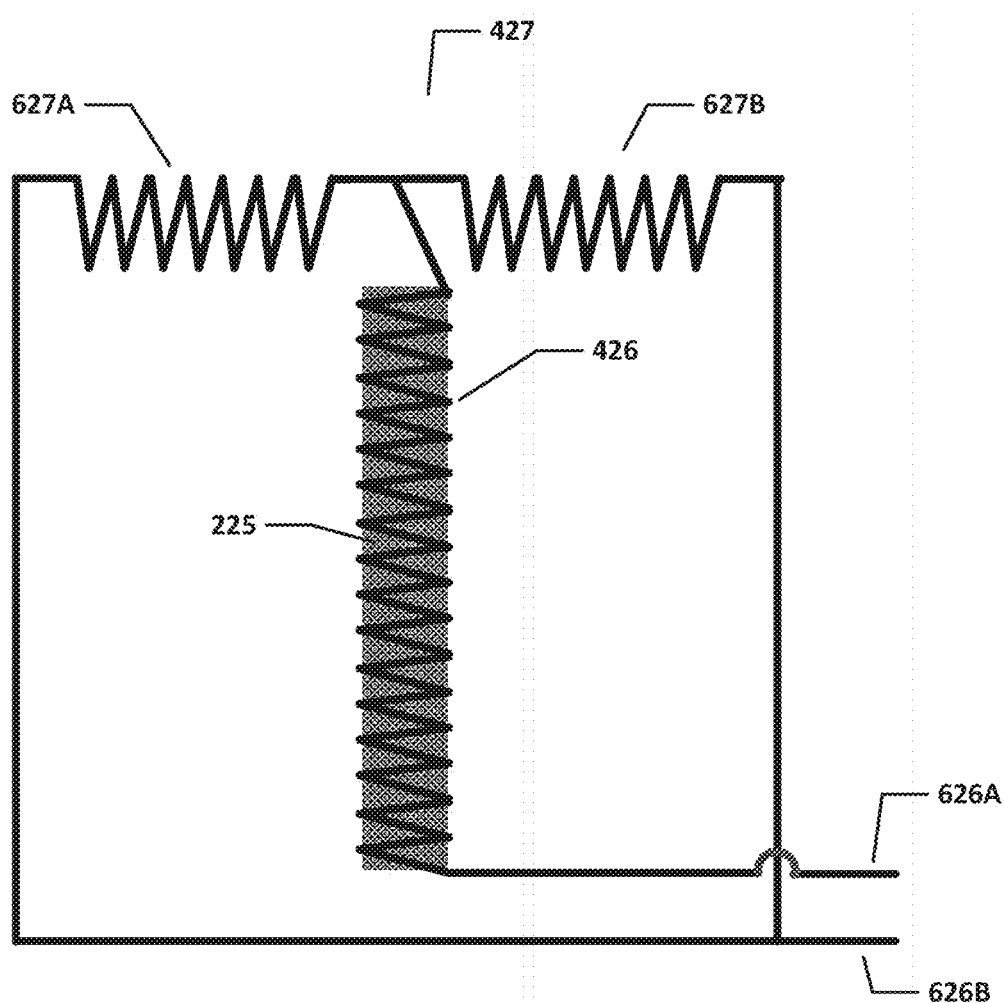
FIGS. 5A and 5B show examples of various possible circuit arrangements for the heater of the e-cigarette of FIG. 1 in accordance with some embodiments of the disclosure.
Figure 5B:
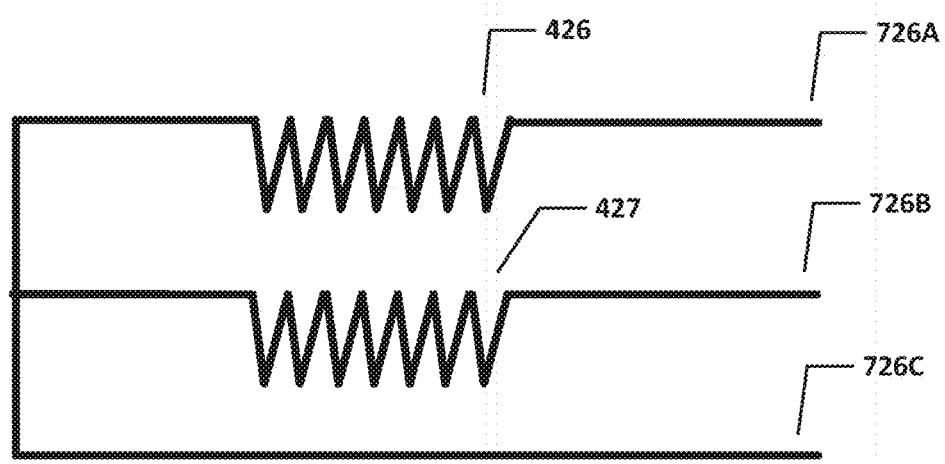

FIGS. 5A and 5B show examples of two possible circuit arrangements for the heater 235 (these diagrams are intended to illustrate electrical connections, rather than physical or spatial configurations). FIG. 5A shows the first coil 426 and the wick 225 connected to the midpoint of the second coil, which is represented by two coil portions 627A and 627B. This arrangement is powered by two terminals 626A and 626B, which can be provided by connector 25A. One potential motivation for this arrangement is that each coil portion 627A, 627B of the second coil 627 only carries half the current of the first coil 426 (assuming the two coil portions 627A, 627B have approximately the same resistance as each other). This may be helpful to reduce the power dissipation in the second coil 427 compared with the power dissipation in the first coil 426, e.g. to protect the second coil 427 and/or to utilize more efficient heating in the first coil 426.

Note that in FIG. 5A, the coil portions 627A, 627B could alternatively be considered as two separate coils. In general, the cartomizer 20 of the present approach is not limited to having just two coils (or, more generally, two resistive heaters), but may have further coils or heaters if so desired according to the particular circumstances of any given implementation.

In FIG. 5A, the cartomizer 20 has only two electrical terminals (in effect, positive and negative) for the electrical connection with the device portion, as represented by contacts 626A and 626B. However, FIG. 5B shows another arrangement, in which the connector 25A supports three (or more) electrical terminals. In this arrangement, a first terminal 726A is used as a supply to the first coil 426 (or heater), and a second terminal 726B is used as a supply to the second coil 427 (or heater), with both coils then sharing a common ground return 726C. It will be appreciated that this configuration offers considerable flexibility, in that the current supplied to the first coil 426 can be set at a level for appropriate vaporization, while the current supplied to the second coil 427 can be set at a different level for thermal sensing (albeit that the second coil 427 still assists in heating and/or vaporization). Note that in this configuration, the current monitor 460 would monitor the current level supplied to the second coil via contact 726B. This arrangement provides good sensitivity to thermal variation, because the sensitivity of the second coil 427 is not, in effect, diluted by the first coil 426, although the connectors 25A, 25B are now more complex (because of the extra terminal)

Considering FIGS. 4A-4C and 5A-5B in general, it can be seen that the first coil 426 and the second coil 427 are examples of electrical resistive heaters, and other forms of such resistive heaters can be used for one or both of these coils as appropriate. In addition, the relative positioning and configuration of the two resistive heaters can be individually modified as appropriate, depending upon the details of any given implementation, and likewise their electrical properties (resistance, connectivity, etc). These variations can be exploited to help address various criteria, such as overall thermal sensitivity (as provided to the monitoring system in the device portion), and the particular needs of the coil or heater having higher thermal sensitivity (e.g. reduced power dissipation, reduced liquid contact, etc).

Overall, the various implementations described herein therefore provide, inter alia, an electronic vapor provision device comprising: a first electrical resistive heater for vaporizing liquid to generate vapor in an airflow for inhalation by a user; a second electrical resistive heater for vaporizing the liquid and/or heating said airflow, wherein the first electrical resistive heater has a first thermal coefficient of resistance which is less than a second thermal coefficient of resistance of the second electrical resistive heater; and a control system configured to monitor for a change in the resistance of at least the second electrical resistive heater.

Typically the first and/or second electrical resistive heaters are wire coils, but some implementations may use other designs. For example, at least one of the first or second electrical resistive heaters may be a wire heater (having some configuration other than a coil), a strip heater, a planar heater, etc. It will also be appreciated that the first and/second electrical resistive heaters may have a different design from one another—for example, the first electrical resistive heater may be a wire coil, while the second electrical resistive heater may be an adjacent strip. The first and second electrical resistive heaters are generally in relatively close proximity to one another, so that overheating in the former (the first electrical resistive heater) will cause a temperature rise of the second resistive heater (and hence an increased resistance in the latter). There are many spatial configurations that may be utilized, for example, coaxial coils, side by side coils, a smaller coil wound around a larger coil, etc.

The first and second electrical resistive heaters are typically made of different materials (to provide different thermal coefficients or resistivity), e.g. two different metals. In other cases, the first and second electrical resistive heaters may be made of the same or similar materials which have been prepared to provide different thermal coefficients or resistivity—for example, by doping, by different internal structures (e.g. analogous to different forms of carbon), by different coatings, etc.

In some cases, at least one of the first and second electrical resistive heaters may be covered, sheathed or coated with an insulating material, such as polytetrafluoroethylene (PTFE). This can then allow the first and second electrical resistive heaters to contact one another, which can be helpful in ensuring good thermal contact between the two heaters and/or in supporting various spatial configurations, while still providing controlled electrical separation between the two heaters. Note that any such insulating material should generally be resistant to the relatively high temperatures and vapors inside an e-cigarette.

Typically the device comprises a re-usable portion including the control system, and a disposable portion including the first and second electrical resistive heaters. In many cases, the re-usable portion and the disposable portion are joined using two electrical contacts, representing positive and negative polarity. In this case the control system generally monitors for a change in total resistance of the disposable portion as a whole, including the combination of the first and second electrical resistive heaters. The second electrical resistive heater can be configured to contribute the major temperature dependency of this total resistance.

In some implementations the control system may comprise a current sensor in combination with a controller. The current sensor can monitor current level as a proxy for resistance (assuming a reasonably steady voltage output from the battery). Typically, the control system is configured to monitor for a change in the resistance of the second electrical resistive heater (either by itself or in combination with the first electrical resistive heater) which is indicative of a rapid and significant rise in temperature, and hence potentially an abnormal situation. The control system can then be configured to reduce or cut off a supply of power to the first and/or second electrical resistive heaters based on the change in the resistance satisfying one or more predetermined criteria that might indicate an abnormal situation. For example, the control system might shut off the power if the monitored resistance indicates a significant rise in temperature of the cartomizer (beyond that which normally occurs during activation of the heater). Accordingly the control system can help protect against a dry-out of the heater, and electrical fault, and other potentially dangerous or undesirable situations.

The implementations described above generally utilize a liquid, e.g. as stored in reservoir, as the precursor for generating the vapor for inhalation by a user. However, other implementations might use a different form of vapor precursor, including a paste, gel, or solid material. In some cases, the vapor precursor may be derived, at least in part, from some form of tobacco or other plant extract (e.g. dried leaf, power, paste, etc.), As noted above, the implementations described above generally utilize one or more coils as the electrical resistive heater(s) for generating the vapor from the vapor precursor material. However, other types or forms of electrical resistive heater are known, such as a planar heater produced by forming a metal track on a substrate (e.g. a printed circuit board), or a metal mesh heater, or a ceramic heater, and so on. Note that the first and second resistive heaters (having a low and high thermal coefficient of resistance respectively) may be the same type of heater, e.g. both coils, as shown in FIG. 4, or may be different types of resistive heater. Furthermore, one or both of the first and second resistive heaters may be formed from a combination of multiple (similar or dissimilar) elements—for example, the first resistive heater might be formed from multiple coils, etc.

The first and second resistive heaters will generally have a positive thermal coefficient of resistance respectively (resistance increases with temperature), however, some materials, e.g. ceramic, may provide a negative thermal coefficient of resistance (resistance decreases with temperature). When we refer herein to one thermal coefficient of resistance being greater or (less) than another thermal coefficient of resistance, this should be understood in terms of magnitude. For example, if the first heater has a thermal coefficient of resistance ($\alpha_1$) which is less than the thermal coefficient of resistance for a second heater ($\alpha_2$), this implies: $|\alpha_1| < |\alpha_2|$ (where $|\alpha|$ denotes the modulus of $\alpha$). It will be appreciated that this is because in general terms, a controller can be made sensitive to either a rise or fall in resistance, hence it is the magnitude of the change in resistance that is important (rather than the sign) in order to facilitate detection.

The first and second electrical resistive heaters are generally in thermal contact with one another, either directly or indirectly. Such thermal contact provides a thermodynamic coupling, whereby heat from the first electrical resistive heater may be transferred to the second electrical resistive heater. This thermodynamic coupling should typically be as strong as possible in order to make the second electric resistive heater (and hence the overall monitoring system) as sensitive as possible to any (potentially anomalous) change in temperature of the first electrical resistive heater. The thermodynamic coupling may utilize one or more forms of heat transfer, such as radiation, convection and/or conduction. In some cases, the thermodynamic coupling may exploit an intermediary—for example, the first electrical resistive heater may have good heat transfer to a wick, and the wick may have good heater transfer to the second electrical resistive heater (thereby providing indirect thermal coupling between the first and second electrical resistive heaters). Note that in some implementations, it may be that it is the temperature of the intermediate component that is most concern. For example, a focus of the second electrical resistive heater might be to help monitor for any excessive temperature of the outer housing of the device, since this is the portion most likely to be touched by the user (albeit that an excessive temperature for the outer housing might be caused by overheating of the first electrical resistive heater).

In order to address various issues and advance the art, this disclosure shows by way of illustration various embodiments in which the claimed invention(s) may be practiced. The advantages and features of the disclosure are of a representative sample of embodiments only, and are not exhaustive and/or exclusive. They are presented only to assist in understanding and to teach the claimed invention (s). It is to be understood that advantages, embodiments, examples, functions, features, structures, and/or other aspects of the disclosure are not to be considered limitations on the disclosure as defined by the claims or limitations on equivalents to the claims, and that other embodiments may be utilized and modifications may be made without departing from the scope of the claims. Various embodiments may suitably comprise, consist of, or consist essentially of, various combinations of the disclosed elements, components, features, parts, steps, means, etc. other than those specifically described herein. The disclosure may include other inventions not presently claimed, but which may be claimed in future.

The invention claimed is:

1. An electronic vapor provision device comprising:
a first electrical resistive heater having a first thermal coefficient of resistance;
a second electrical resistive heater having a second thermal coefficient of resistance that is at least two times larger than the first thermal coefficient of resistance;
a wick for transporting e-liquid from a reservoir to the first electrical resistive heater and the second electrical resistive heater; and
a control system configured to monitor for a change in resistance of the second electrical resistive heater,
wherein the first electrical resistive heater and the second electrical resistive heater are each mounted around the wick.

2. The electronic vapor provision device of claim 1, wherein the first electrical resistive heater comprises a first coil and the second electrical resistive heater comprises a second coil and wherein the first coil and the second coil are each wrapped around the wick.

3. The electronic vapor provision device of claim 2, wherein the first coil comprises nichrome and the second coil comprises titanium.

4. The electronic vapor provisional device of claim 2, wherein the second coil has a second radius that is larger than a first radius of the first coil.

5. The electronic vapor provisional device of claim 2, wherein the second coil has a second length that is less than a first length of the first coil.

6. The electronic vapor provision device of claim 1, wherein the first electrical resistive heater comprises a first coil and the second electrical resistive heater comprises one or more strip heaters.

7. The electronic vapor provision device of claim 1, wherein the second thermal coefficient of resistance is at least four times larger than the first thermal coefficient of resistance.

8. The electronic vapor provision device of claim 7, wherein the second thermal coefficient of resistance is at least eight times larger than the first thermal coefficient of resistance.

9. The electronic vapor provision device of claim 1, wherein the control system comprises a current sensor to monitor a current level of the second electrical resistive heater.

10. The electronic vapor provision device of claim 1, wherein the first electrical resistive heater and the second electrical resistive heater are arranged to aerosolize the same e-liquid from the reservoir.

11. A cartridge for use in an electronic vapor provision device, the cartridge comprising:
a first electrical resistive heater having a first thermal coefficient of resistance;
a second electrical resistive heater having a second thermal coefficient of resistance that is at least two times larger than the first thermal coefficient of resistance;
a wick for transporting e-liquid from a reservoir to the first electrical resistive heater and the second electrical resistive heater; and
a connection for electrically connecting the cartridge to a control system configured to monitor for a change in resistance of the second electrical resistive heater,
wherein the first electrical resistive heater and the second electrical resistive heater are each mounted around the wick.

12. The cartridge of claim 11, wherein the first electrical resistive heater comprises a first coil and the second electrical resistive heater comprises a second coil and wherein the first coil and the second coil are each wrapped around the wick.

13. The cartridge of claim 12, wherein the first coil comprises nichrome and the second coil comprises titanium.

14. The cartridge of claim 12, wherein the second coil has a second radius that is larger than a first radius of the first coil.

15. A method of operating an electronic vapor provision device, comprising:
transporting e-liquid from a reservoir to a wick;
vaporizing a precursor material using the first electrical resistive heater mounted on the wick to generate vapor in an airflow for inhalation by a user;
vaporizing the precursor material using the second electrical resistive heater mounted on the wick to generate vapor in an airflow for inhalation by a user, wherein the second electrical resistive heater has a second thermal coefficient of resistance that is at least two times larger than a first thermal coefficient of resistance of the first electrical resistive heater; and
monitoring, by a control system, for a change in resistance of the second electrical resistive heater.

* * * * *